(12) United States Patent
Erbetta et al.

(10) Patent No.: US 8,993,374 B2
(45) Date of Patent: Mar. 31, 2015

(54) PHASE CHANGE MATERIAL GRADIENT STRUCTURES AND METHODS

(75) Inventors: Davide Erbetta, Trezzo sull' Adda (IT); Luca Fumagalli, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/566,375

(22) Filed: Aug. 3, 2012

(65) Prior Publication Data

US 2014/0034892 A1    Feb. 6, 2014

(51) Int. Cl.
  *H01L 47/00* (2006.01)
  *H01L 27/24* (2006.01)
  *H01L 45/00* (2006.01)

(52) U.S. Cl.
  CPC ............ *H01L 45/06* (2013.01); *H01L 27/2427* (2013.01); *H01L 45/144* (2013.01); *H01L 45/1616* (2013.01); *H01L 45/1625* (2013.01); *H01L 45/165* (2013.01); *H01L 45/1675* (2013.01)
  USPC ............ 438/102; 257/E47.001; 257/E21.068; 257/E45.001; 257/E45.002; 257/5

(58) Field of Classification Search
  USPC .......................... 438/102, 381, 382, 702, 478
  See application file for complete search history.

(56) References Cited

U.S. PATENT DOCUMENTS

| | | | |
|---|---|---|---|
| 4,177,475 A | 12/1979 | Holmberg | |
| 7,754,522 B2 | 7/2010 | Liu | |
| 7,960,775 B2 | 6/2011 | Courtade et al. | |
| 2007/0034905 A1 | 2/2007 | Elkins | |
| 2010/0038614 A1* | 2/2010 | Hampton | 257/2 |
| 2010/0314601 A1* | 12/2010 | Lee | 257/4 |
| 2010/0328996 A1 | 12/2010 | Shih et al. | |
| 2011/0049456 A1 | 3/2011 | Lung et al. | |
| 2011/0084240 A1 | 4/2011 | Schell et al. | |
| 2012/0119177 A1 | 5/2012 | Erbetta | |
| 2013/0214236 A1* | 8/2013 | Lu et al. | 257/4 |

\* cited by examiner

*Primary Examiner* — Chuong A Luu
*Assistant Examiner* — Rodolfo Fortich
(74) *Attorney, Agent, or Firm* — Brooks, Cameron & Huebsch, PLLC

(57) ABSTRACT

Memory cells and memory cell structures having a number of phase change material gradients, devices utilizing the same, and methods of forming the same are disclosed herein. One example of forming a memory cell includes forming a first electrode material, forming a phase change material gradient on the first electrode material, and forming a second electrode material on the phase change material gradient.

30 Claims, 4 Drawing Sheets

PHASE CHANGE MATERIAL GRADIENT STRUCTURES AND METHODS

TECHNICAL FIELD

The present disclosure relates generally to semiconductor memory cells and methods, and, more particularly, to phase change material gradient structures and methods.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistance variable memory, and flash memory, among others. Types of resistance variable memory include resistive random access memory (RRAM), phase change random access memory (PCRAM), conductive bridge random access memory (CBRAM), and/or spin transfer torque random access memory (STT-RAM), among others.

Various resistance variable memory cells can include a select device, e.g., a switching element such as a transistor or diode, coupled to a storage element, e.g., a resistance variable storage element including a phase change material (PCM) or a metal oxide material between a pair of electrodes, for instance.

DETAILED DESCRIPTION

Figure 1A:
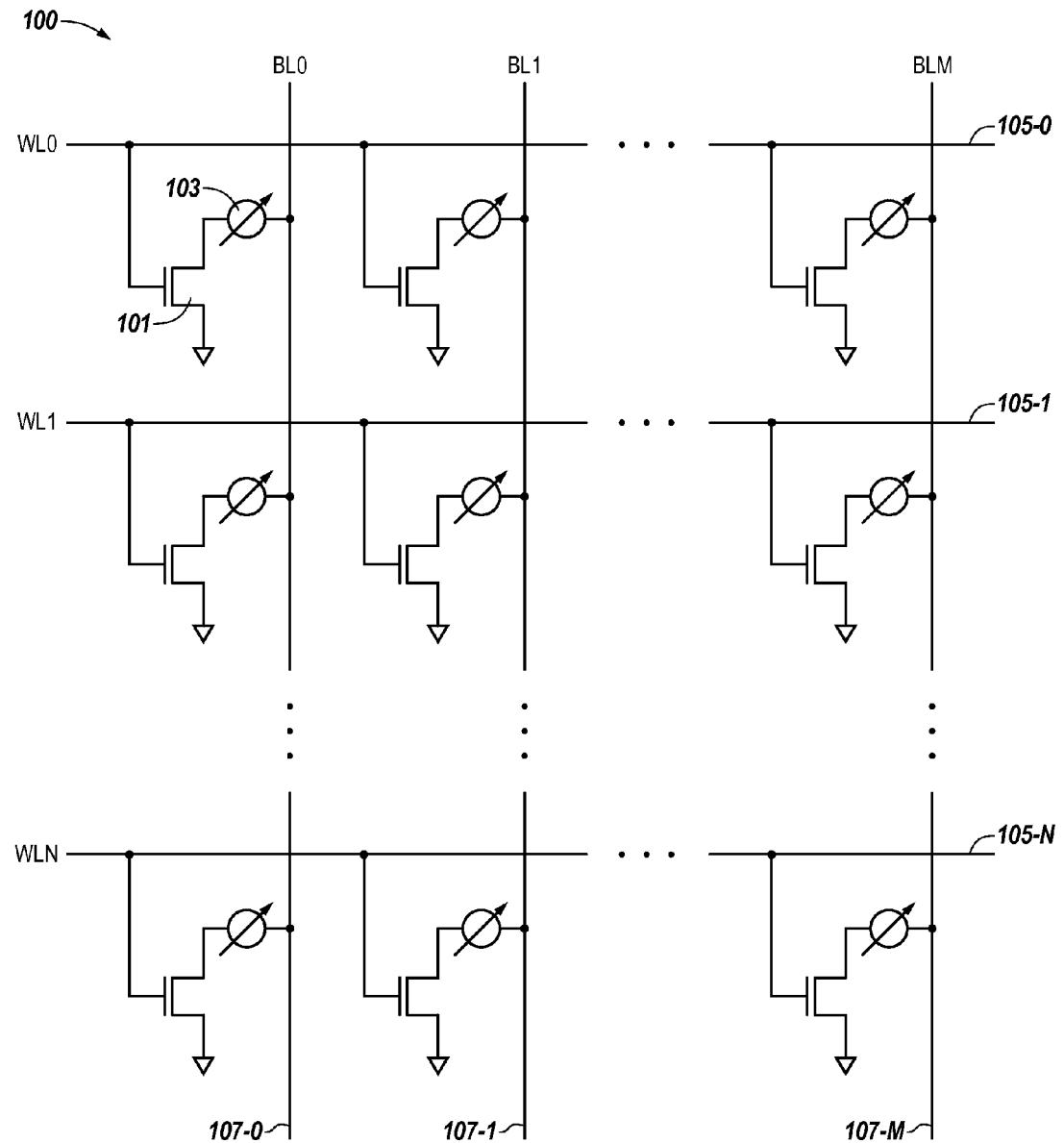
FIG. 1A is a schematic of a portion of a phase change memory array having phase change memory structures in accordance with a number of embodiments of the present disclosure.

Memory cells and memory cell structures having a number of PCM gradients, devices utilizing the same, and methods of forming the same are disclosed herein. One example of forming a memory cell includes forming a first electrode material, forming a PCM gradient on the first electrode material, and forming a second electrode material on the PCM gradient.

A memory cell with a PCM, e.g., a germanium (Ge)-antimony (Sb)-tellurium (Te) (Ge—Sb—Te) material, can, for example, have a gradient with a variation in a stoichiometry of at least one of the elements of the PCM, e.g., $Ge_xSb_yTe_z$ where the values of the x, y, and/or z coefficients can, for example, vary in a predetermined manner, as described herein. For example, rates and/or concentrations of chemicals, e.g., elements, molecules, ions thereof, etc., used for deposition and/or implantation, among other techniques described herein, can be varied in predetermined manners to accomplish substantially predetermined variations in stoichiometries of the PCMs described herein.

Embodiments of the present disclosure can provide benefits by varying stoichiometric values of the elements of a PCM to achieve particular beneficial characteristics. For instance, a gradient can have an elevated stoichiometric value for $Ge_x$, which can improve adhesion to an adjacent electrode, an elevated stoichiometric value for $Sb_y$ in a region of the memory cell adjacent a heater associated with an electrode, which can improve retention of memory, e.g., stored bits, among other benefits conferred by stoichiometric differences associated with the PCM.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense. As utilized herein, referring to an element and/or a feature can refer to one or more of such elements and/or features, as can referring to "a number of" such elements and/or features. Moreover, as utilized herein, forming a first element and/or feature "on" a second element and/or feature can denote forming the first element and/or feature on a particular surface of the second element and/or feature.

FIG. 1A is a schematic of a portion of a phase change memory array having phase change memory structures in accordance with a number of embodiments of the present disclosure. In the embodiment illustrated in FIG. 1A, the memory array 100 includes a number of phase change memory cells each having an associated access device 101 and a resistance variable storage element 103, e.g., a PCM. The access devices 101 can be operated, e.g., turned on/off, to access the memory cells in order to perform operations such as data programming, e.g., writing, and/or data sensing, e.g., reading, operations on the resistance variable elements 103.

As shown in FIG. 1A, a gate of each access device 101 associated with each memory cell is coupled to one of a number of conductive access lines 105-0 (WL0), 105-1 (WL1), . . . , 105-N (WLN), e.g., each access line 105-0, 105-1, . . . , 105-N can be coupled to a row of phase change memory cells. The access lines 105-0, 105-1, . . . , 105-N may be referred to herein as "word lines." The designator "N" is used to indicate that a memory array can include a number of word lines.

The storage elements 103 can be formed, in various embodiments, from a number of PCMs. Such PCMs can, in various embodiments, be a number of chalcogenide alloys. Chalcogenide alloys can include Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other chalcogenide alloys. The hyphenated chemical composition notation, as used herein, indicates the elements included in a particular mixture or compound, e.g., chalcogenide alloy, and is intended to represent all stoichiometries involving the indicated elements, e.g., $Ge_xSb_yTe_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

Other examples of resistance variable materials usable in storage elements include transition metal oxide materials or alloys including two or more metals, e.g., transition metals, alkaline earth metals, and/or rare earth metals. Embodiments are not limited to a particular resistance variable material or materials associated with the storage elements of the memory array 100. For instance, other examples of resistance variable materials that can be used to form storage elements include binary metal oxide materials, colossal magnetoresistive materials, and/or various polymer based resistance variable materials, among others.

In the embodiment illustrated in FIG. 1A, each resistance variable element 103 is coupled to one of a number of conductive data lines 107-0 (BL0), 107-1 (BL1), . . . , 107-M (BLM), i.e., each data line 107-0, 107-1, . . . , 107-M is coupled to a column of phase change memory cells. The data lines 107-0, 107-1, . . . , 107-M may be referred to herein as "bit lines" or "sense lines." The designator "M" is used to indicate that a memory array can include a number of bit lines. As will be appreciated, each resistance variable element 103 formed, in various embodiments, from a PCM can be coupled to, e.g., directly or indirectly connected to via circuitry, a word line 105 and a bit line 107, for example, by a pair of electrodes. For ease of addressing in the digital environment, the number of word lines 105-1, . . . , 105-N and the number of bit lines 107-1, . . . , 107-M can each be some power of two, e.g., 256 word lines by 4,096 bit lines. However, embodiments are not limited to particular numbers of word lines and/or bit lines.

In operation, appropriate voltage and/or current signals, e.g., pulses, can be applied to the bit lines 107-0, 107-1, . . . , 107-M and/or word lines 105-0, 105-1, . . . , 105-N in order to program data to and/or read data from the phase change memory cells of the array 100. As an example, the data stored by a phase change memory cell of array 100 can be determined by turning on an access device 101 and sensing a current passing through the phase change element 103. The current sensed on the bit line associated with the memory cell being read corresponds to a resistance level of the phase change element 103, which in turn corresponds to a particular data value, e.g., a binary value such as 1, 0, 001, 111, 1011, etc.

Embodiments of the present disclosure are not limited to the example array 100 illustrated in FIG. 1A. In addition, in various embodiments, the access devices 101 can be an ovonic threshold switch (OTS), a metal oxide semiconductor field effect transistor (MOSFET), a bipolar junction transistor (BJT), and/or a diode, e.g., p-n diode, a Schottky diode, and/or a Zener diode, among other types of access devices. Although not illustrated in FIG. 1A, one of ordinary skill in the art will appreciate that the phase change memory array 100 can be coupled to other memory components including a controller and various write/read circuitry and/or other control circuitry.

Figure 2A:
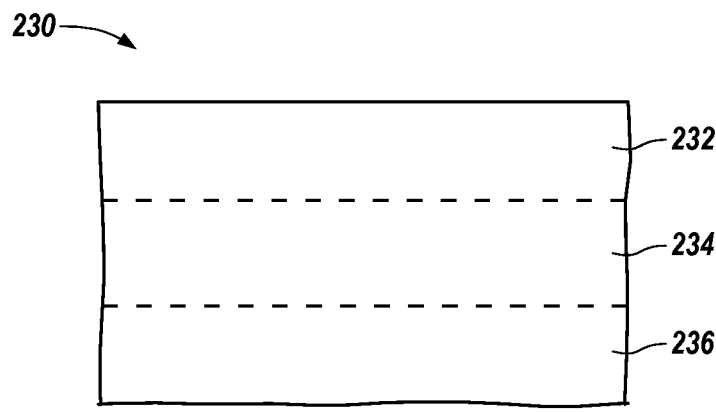
FIG. 2A illustrates a cross-sectional view of a portion of a phase change material gradient structure formed in accordance with a number of embodiments of the present disclosure.
Figure 2B:
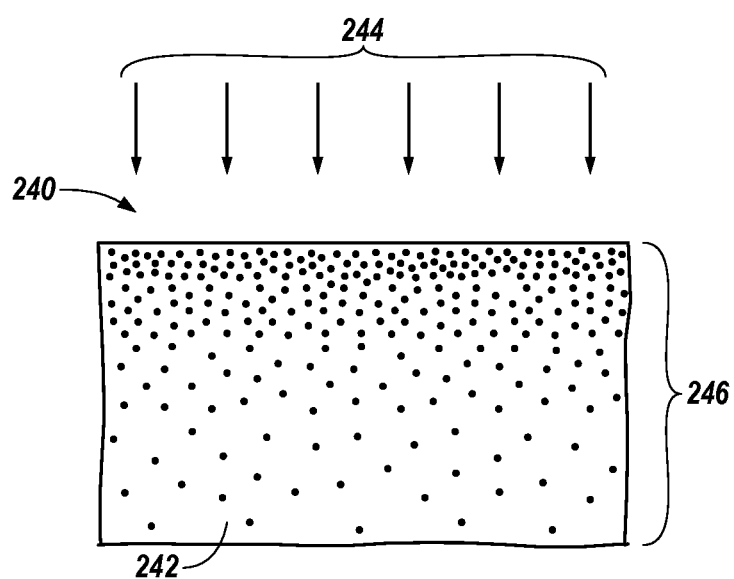
FIG. 2B illustrates another cross-sectional view of a portion of a phase change material gradient structure formed in accordance with a number of embodiments of the present disclosure.
Figure 3:
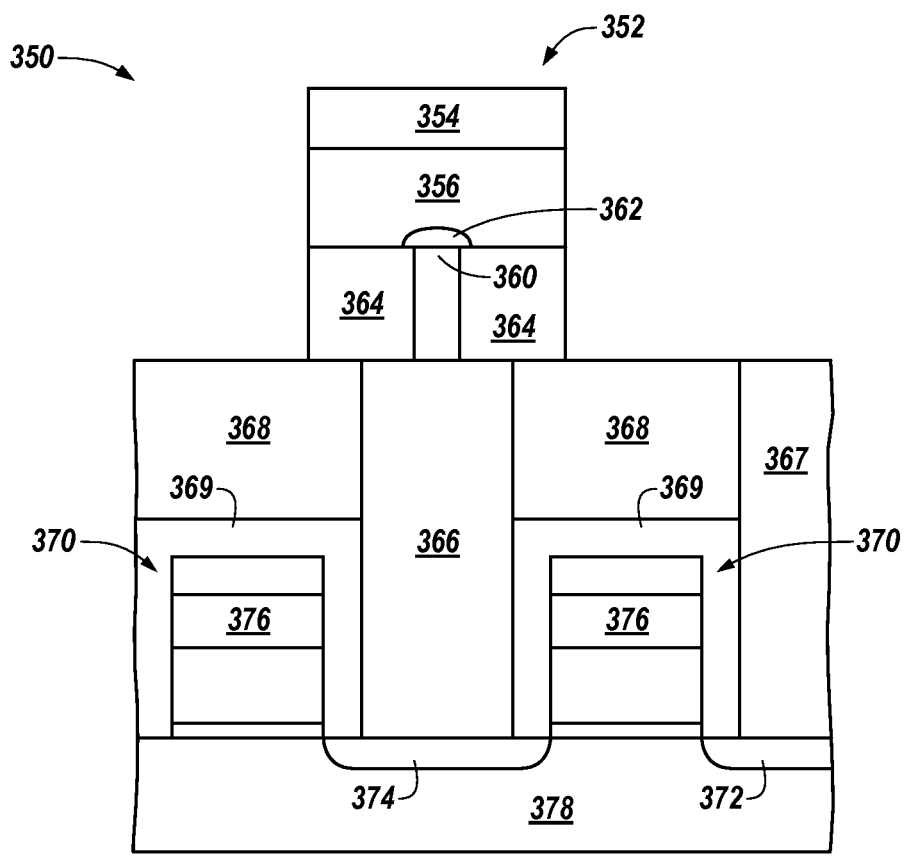
FIG. 3 is a cross-sectional view of a portion of a memory device comprising a phase change memory structure in accordance with a number of embodiments of the present disclosure.

Accordingly, as described herein in a number of embodiments, a memory cell structure can include a first electrode, a PCM gradient formed on the first electrode, and a second electrode formed on the PCM gradient, as described further in connection with FIGS. 2A-2B and 3. In a number of embodiments, the first electrode and/or the second electrode can be coupled to a conductive line.

As described herein, the PCM gradient of a phase change memory cell can comprise a PCM. The PCM gradient can, in a number of embodiments, be formed from a number of chalcogenide alloys. At least one of the number of chalcogenide alloys can be formed having a variation in stoichiometry, e.g., of elements of the chalcogenide alloy.

Figure 1B:
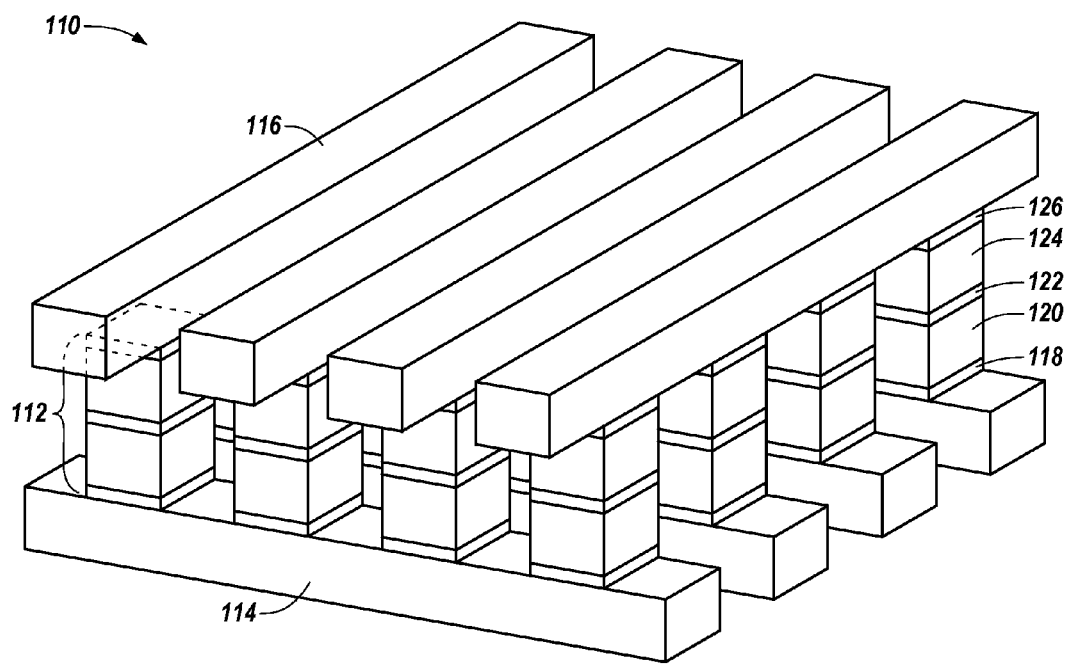
FIG. 1B illustrates a perspective view of a portion of a phase change memory array having phase change memory structures in accordance with a number of embodiments of the present disclosure.

FIG. 1B illustrates a perspective view of a portion of a phase change memory array having phase change memory structures in accordance with a number of embodiments of the present disclosure. The phase change memory array 110 can have a cross-point architecture having memory cells 112 located at the intersections of a number of conductive lines 114, e.g., access lines, which may be referred to herein as word lines, and a number of conductive lines 116, e.g., data/sense lines, which may be referred to herein as bit lines. As illustrated, the word lines 114 are substantially parallel to each other and are substantially orthogonal to the bit lines 116, which are substantially parallel to each other. However, embodiments are not limited to a parallel/orthogonal configuration.

As used herein, the term "substantially" intends that the modified characteristic needs not be absolute, but is close enough so as to achieve the advantages of the characteristic. For example, "substantially parallel" is not limited to absolute parallelism, and can include orientations that are at least closer to a parallel orientation than a perpendicular orientation. Similarly, "substantially orthogonal" is not limited to absolute orthogonalism, and can include orientations that are at least closer to a perpendicular orientation than a parallel orientation.

In various embodiments, the memory cells 112 can have a "stack" structure. Each memory cell 112 can include a storage element connected in series with a respective cell select device, e.g., a cell access device, formed between word lines 114 and bit lines 116. The storage element can be a resistance variable storage element. The storage element can include a PCM 120 formed between a pair of electrodes 118 and 122. The cell select device can include a select device material 124 formed between a pair of electrodes 122 and 126. In some embodiments, the PCM 120 can be formed between electrodes 122 and 126 and the select device material 124 can be formed between electrodes 118 and 122.

Active memory cell materials can include active materials associated with a storage element, e.g., resistive storage materials including resistance variable materials such as PCMs, metal oxide materials, etc., as well as active materials associated with a select device. For example, a number of chalcogenide alloys can be utilized in forming a storage element and/or an OTS, for instance. The memory cells 112 of memory array 110 can include the cell select device material 124 in series with the PCM 120 utilized as a storage element, such that the memory array 110 can be referred to as a PCM and switch (PCMS) array. In a number of embodiments, the cell select device can be a two-terminal OTS, for instance. An OTS can include, for example, a chalcogenide material formed between a pair of conductive materials, e.g., conductive electrodes. Responsive to an applied voltage across the OTS that is less than a threshold voltage, the OTS can remain in an "off" state, e.g., an electrically nonconductive state. Alternatively, responsive to an applied voltage across the OTS that is greater than the threshold voltage, the OTS can enter an "on" state, e.g., an electrically conductive state. Responsive to an applied voltage near a threshold voltage, the voltage across the OTS may "snapback" to a holding voltage.

In a number of embodiments, the storage element can be a two-terminal phase change storage element, e.g., a PCM formed between a pair of electrodes. However, embodiments of the present disclosure are not limited to PCMS cross-point arrays and/or a particular cell select switch. For instance, the methods and structures of the present disclosure can be applied to other cross-point arrays, such as arrays utilizing resistive random access memory (RRAM) cells, conductive bridging random access memory (CBRAM) cells, and/or spin transfer torque random access memory (STT-RAM) cells, among other types of memory cells, for example.

Storage element materials and/or select device materials can be formed, in various embodiments, from a number of PCMs. Such PCMs can, in various embodiments, be a number of chalcogenide alloys as described in connection with FIG. 1A.

In a number of embodiments, an electrode can be shared between the cell select device and the storage element of the memory cell 112. In addition, in a number of embodiments, the word lines 114 and the bit lines 116 can serve as top or bottom electrodes corresponding to the memory cells 112.

In a number of embodiments, the storage element material 120 can comprise one or more of the same material(s) as the cell select device material 124. However, embodiments are not so limited. For example, the storage element material 120 and the cell select device material 124 can comprise different materials.

The materials described herein may be formed by various techniques including, but not limited to, spin coating, blanket coating, chemical vapor deposition (CVD) such as low pressure CVD, plasma enhanced chemical vapor deposition (PECVD), atomic layer deposition (ALD), plasma enhanced ALD, physical vapor deposition (PVD), ion implantation, outdiffusion and/or outgassing, thermal decomposition, and/or thermal growth, among others. Alternatively and/or in addition, materials may be grown in situ. While the materials described and illustrated herein may be formed as layers, the materials are not limited thereto and may be formed in other three-dimensional configurations.

According to a number of embodiments of the present disclosure, a memory cell can be formed by forming an active storage element material and an active select device material arranged in series between a pair of electrodes and forming a PCM gradient in at least one of the active storage element material and the active select device material, as described below. In a number of embodiments, forming the memory cell can include forming an electrode material between the active storage element material and the active select device material, e.g., FIG. 1B at 122. In a number of embodiments, the active storage element material can be an active resistance variable storage element material and/or the active select device material can be an OTS.

Accordingly, in a number of embodiments, a memory cell structure can include a storage element material and a select device material arranged in series between a first electrode and a second electrode and a PCM gradient in at least one of the storage element material and the select device material. The memory cell structure can, in a number of embodiments, include a third electrode, e.g., FIG. 1B at 122, formed between the storage element material and the select device material.

As described herein, at least one of the storage element material and the select device material can include at least one chalcogenide, e.g., a chalcogenide material and/or a chalcogenide alloy. Accordingly, at least one of the storage element material and the select device material can be formed with at least one chalcogenide alloy having a variation in stoichiometry, e.g., of elements of the chalcogenide alloy.

Although not illustrated in FIG. 1B, in a number of embodiments, the memory array 110 can be part of a three-dimensional (3D) architecture, with a number of planes, e.g., tiles, decks, that are vertically stacked on each other. In such embodiments, conductive lines 114 and 116 can be communicatively coupled to memory cells of two planes of the 3D array, for instance. Additionally, the memory array 110 can be connected, e.g., via conductive lines 114 and 116, to circuitry associated with the memory array, e.g., decode circuitry, among various other circuitry associated with operating memory array. Elements, e.g., transistors, etc., of such circuitry associated with the memory array 110 can be formed to underlie the memory array, for instance.

FIG. 2A illustrates a cross-sectional view of a portion of a PCM gradient structure formed in accordance with a number of embodiments of the present disclosure. The portion of the PCM gradient 230 illustrated in FIG. 2A can, in various embodiments, be positioned and/or formed between a pair of electrodes, e.g., as shown in FIGS. 1A-1B and 3. The PCM gradient 230 can be formed from a gradient of a number of PCMs that differ in chemical composition. The chemical compositions of the gradient of the number of PCMs can differ, for example, by being formed from a plurality of PCM alloys, where at least one of the adjacent PCM alloys has a chemical composition that differs from the chemical composition of another adjacent PCM alloy. For example, the gradient can be formed from: Ge—Sb—Te and In—Sb—Te; Ge—Sb—Te, Ge—Te, and In—Sb—Te; Ge—Sb—Te, In—Sb—Te, and Ge—Sb—Te; Ge—Sb—Te, Ge—Te, Sn—Sb—Te, and In—Sb—Te; among numerous other gradients of PCM alloys having at least one of the adjacent PCM alloys that has a chemical composition that differs from the chemical composition of another adjacent PCM alloy.

In addition, or in the alternative, the chemical compositions of the gradient can differ, for example, by being formed from a single PCM alloy, where at least one of the adjacent PCMs has a chemical composition that differs from the chemical composition of another adjacent PCM. For example, the gradient can be formed from the $Ge_xSb_yTe_z$ alloy having variations in stoichiometries, such as $Ge_2Sb_2Te_5$, $Ge_2Sb_2Te_7$, $Ge_1Sb_2Te_4$, $Ge_1Sb_4Te_7$, etc., to form the gradient. In addition, in various embodiments, the gradient can be formed from a plurality of PCM alloys combined with at least one of the plurality of the PCM alloys having the variations in stoichiometries.

By way of illustration and not by way of limitation, the portion of the PCM gradient 230 illustrated in FIG. 2A shows three PCMs in the gradient at 232, 234, and 236. However, the PCM gradient 230 can comprise more or fewer than three PCMs. Moreover, for ease of illustration, the portion of the PCM gradient 230 illustrated in FIG. 2A shows three distinct horizontal layers of PCMs. Although a PCM gradient can be formed as such consistent with the present disclosure, a PCM gradient or a number of portions of a PCM gradient can be a continuous gradient formed by a number of PCM alloys having variations in stoichiometry, e.g., such that that distinct layers are not formed. Further, in various embodiments, the gradient can be formed having a horizontal, vertical, diagonal, curved, and/or irregular orientation relative to a particular adjacent electrode, among other orientations.

As described herein, a number of chalcogenides can form, e.g., be deposited as, active material for a PCM memory cell. The particular chalcogenides and/or the particular stoichiometric values of the elements thereof can be selected to address specific and/or different electrical, thermal, and/or mechanical requirements, among others, of different regions of a PCM memory cell. The particular chalcogenides and/or the particular stoichiometric values of the elements thereof can be utilized to form a gradient having compositional and/or elemental contributions at predetermined positions in a bottom, center, top and/or edge, or any other useful orientation, of PCM portion of the memory cell. Embodiments of the present disclosure can provide benefits by varying stoichiometric values of the elements of a PCM to achieve particular beneficial characteristics. For instance, a gradient can have an elevated stoichiometric value for $Ge_x$, which can improve adhesion to an adjacent electrode, an elevated stoichiometric value for $Sb_y$, in a region of the memory cell adjacent a heater associated with an electrode, which can improve retention of memory, e.g., stored bits, among other benefits conferred by stoichiometric differences associated with the PCM, and/or similar or different benefits can be conferred by particular dopant implantation, as described with regard to FIG. 2B.

In contrast, a chalcogenide with a uniform composition can be utilized in PCM memory cell where the chalcogenide adequately addresses some of the different electrical, thermal, and/or mechanical requirements, among others, of the different regions of the PCM memory cell, but is inadequate to address other requirements. This could induce inefficiency in an effort to find a particular chalcogenide material having an adequate balance between the different requirements. Instead of utilizing a chalcogenide material with a uniform composition throughout the active material for the PCM memory cell, a PCM gradient of composition can be formed and utilized, as described herein. That is, a number of PCMs and/or dopants in a number of gradients can be tuned to address the different requirements.

By way of illustration and not by way of limitation, at least a portion of a PCM gradient can be formed as follows. In a PCM or PCMS memory cell, a number of chalcogenides can be deposited from bottom to top, or in any other useful orientation. For example, a substrate including a bottom electrode, e.g., TiN, formed in previous fabrication steps can be utilized. A deposition of a Ge—Sb—Te alloy can be performed in order to form a gradient.

In the case of PVD, deposition can, for example, be performed by including a sufficient amount of argon in the chamber for plasma ignition. A cathode source of a first element of the three elements of Ge—Sb—Te can be set at a fixed power for a fixed rate of sputtering of the first element. A cathode source of a second element of the three elements of Ge—Sb—Te can begin at a low wattage, e.g., zero watts, and the wattage can rise with a predetermined slope to an elevated value. A cathode source of a third element of the three elements of Ge—Sb—Te can begin at an elevated value and then decrease with a predetermined slope to a low wattage. The process can be completed by forming a top electrode on the PCM gradient, e.g., by deposition.

The PVD process just described can form a gradient of the $Ge_xSb_yTe_z$ alloy where the values of x, y, and/or z vary in a predetermined manner to form various different gradients, dependent upon the predetermined slopes of the wattages applied to the three cathodes and the resultant effect on the sputtering rates of each of the three elements, e.g., differential sputtering rates. For example, a fixed positive or negative slope for any one of the three elements of the $Ge_xSb_yTe_z$ alloy can result in a continuous change in the contribution of that element to the alloy such that a continuous gradient is formed, e.g., having no distinct layers. As one alternative, a layered configuration can be formed by markedly altering the slope for any one of the three elements of the $Ge_xSb_yTe_z$ alloy at a time point, e.g., markedly increasing or decreasing the sputtering rate at a predetermined time point.

In various embodiments, a first cathode can be a source of a single element or the first cathode can be a source for multiple elements having a fixed ratio. In the latter case, a number of other cathodes can provide other elements to mix with the elements provided by the first electrode to form a gradient or the number of other cathodes can provide the same elements but with different ratios and/or at different rates in order to form a gradient by varying the wattages applied to the electrodes, for example.

The PVD process just described is presented as a non-limiting example. The same concept can be applied to any other chalcogenide alloy and/or other PCM by utilizing alternative processes. For example, CVD can be utilized in which chemical precursors for a chemical reaction to form the alloy are used, instead of cathodes as sources for the elements. In various embodiments, ALD can be utilized, which is similar to CVD, except that the ALD reaction breaks the CVD reaction into half-reactions by keeping precursor materials separate during the reaction. The PVD, CVD, and ALD processes are presented by way of example and not by way of limitation.

As such, as described herein, forming a PCM gradient can include forming a number of chalcogenide alloys. Forming the number of chalcogenide alloys can include forming at least one of the number of chalcogenide alloys having a variation in stoichiometry, e.g., of elements of the chalcogenide alloy. Accordingly, in some embodiments, forming the at least one of the number of chalcogenide alloys having the variation in stoichiometry can include forming a number of different and adjacent chalcogenide alloys, e.g., to form a gradient having distinct layers of distinguishable chalcogenide alloys. Alternatively, or in addition, the at least one of the number of chalcogenide alloys can be formed by supplying a first element at a substantially constant rate and/or concentration and supplying a second element with a predetermined variation in a rate and/or a concentration. Forming the at least one of the number of chalcogenide alloys can, in various embodiments, be performed by supplying a first element with a predetermined increase in a rate and/or a concentration and by supplying a second element with a predetermined, e.g., complementary, decrease in the rate and/or the concentration. In some embodiments, a third element can be supplied with a predetermined variation in a rate and/or a concentration.

As described herein, the PCM gradient 230 can be formed from at least one chalcogenide alloy having a variation in a stoichiometric contribution of at least one of a number of elements of the chalcogenide alloy to form the gradient. In a number of embodiments, the gradient can be formed having an increase in the stoichiometric contribution of at least one of the number of elements from a region adjacent to the first electrode to a region adjacent to the second electrode. In a number of embodiments, the gradient can be formed having a decrease in the stoichiometric contribution of at least one of the number of elements from a region adjacent to the first electrode to a region adjacent to the second electrode. In a number of embodiments, the gradient can be formed having increased or decreased stoichiometric contributions of at least one of the number of elements between a region adjacent to the first electrode and a region adjacent to the second electrode relative to the region adjacent to the first electrode and the region adjacent to the second electrode. In various embodiments, the rates and/or degrees of such increases and/or decreases can be predetermined.

FIG. 2B illustrates another cross-sectional view of a portion of a PCM gradient structure formed in accordance with a number of embodiments of the present disclosure. The processes for PCM gradient formation described with regard to FIG. 2A can be combined with or replaced by utilizing a process, e.g., ion implantation, to provide a number of chemicals, e.g., elements, molecules, ions thereof, etc., to form the gradient. In some embodiments, ion implantation can be utilized to vary the concentration of one or more chemicals already present in the PCM. For example, implanting Ge in GST can vary the Ge concentration, e.g., by increasing the x coefficient in $Ge_xSb_yTe_z$. Alternatively and/or in addition, utilizing the ion implantation process can contribute to implanting a number of dopant chemicals, e.g., elements, molecules, ions thereof, etc., to form the gradient, where a dopant is different from the chemicals already present in the PCM.

For example, a varying concentration of a number of gases, ions, vapors, plasmas, metals, e.g., elements of the PCM, nitrogen, oxygen, arsenic, carbon, titanium, etc., can be supplied in the chamber in order to create a gradient in the PCM as it is being formed, e.g., deposited. The element or elements contributing to the gradient can contribute to performing functions similar to or different from those performed by gradients formed from the PCMs themselves, e.g., by adding a number of dopants.

As such, as illustrated in FIG. 2B, a portion of a PCM gradient structure 240 is shown. The portion of a PCM gradient structure 240 includes a number of PCMs 242, as described herein, that is exposed at predetermined time points, e.g., during formation, to predetermined concentrations of a number of dopants 244 to form a dopant gradient 246 therein. The dopant gradient 246 illustrated in FIG. 2B, e.g., having a higher density of dopant near the upper surface and progressively decreasing with depth, is shown by way of example and not by way of limitation. In addition, the depth of the dopant gradient 246 in the PCM 242 is determined by the particular process utilized and does not necessarily extend to the bottom of the PCM 242.

Alternatively, or in addition to implantation by exposing the number of PCMs to dopants during formation, other dopant implantation processes can be performed to provide a number of dopants to form the gradient. The other dopant implantation processes described herein are presented by way of example and not by way of limitation.

For example, an ion implantation process can create separate regions having different thermal conductivities, e.g., a first region having a thermal conductivity K1, a second region having a thermal conductivity K2, and a third region having a thermal conductivity K3. When the ion implantation is performed using a photomask, for example, the regions can be formed substantially on a same plane or level such that a gradient can vary horizontally and/or vertically relative to adjacent electrodes. Embodiments are not limited to a particular type of ion implantation. The particular type of ion implantation can depend on various factors such as the type of PCM and/or a desired thermal conductivity for an altered region, among other factors.

In a number of embodiments, a high flux energetic species ion, e.g., dopant, implantation process can be used to implant the energetic species in an upper portion of the PCM. As used herein, an upper portion of the PCM includes an exposed surface along with a predetermined depth of the PCM. Such energetic species can include heavy ions formed in a plasma process from elements and/or compounds from either a single source atom type or molecular species that have mass generally above silicon. Examples of such heavy ions include, but are not limited to, $BF_2$, $GeH_4$, As, P, Se compounds, Ar, $N_2$, $O_2$, and Sb, or the elements already present in the PCM. The energetic species implanted in the upper portion of the PCM can have a gradation of energetic species that decreases as the distance from the surface into the PCM increases. Values for the density of atoms per area for the energetic species can vary, e.g., being in a range from about $10^{14}$ atoms/cm$^2$ to about $10^{18}$ atoms/cm$^2$, in order to achieve one to a few monolayers of the energetic species implanted in the PCM. Examples of suitable devices for generating the high flux of energetic species include, but are not limited to, plasma source ion implantation (MI), gas cluster ion plasma, and high density plasma tool devices, as are known. In various embodiments, the devices can be operated to implant the energetic species having multiple ion incident angles.

The foregoing processes described with regard to FIGS. 2A-2B can, in various embodiments as described herein, be implemented by utilizing a PVD process, a CVD process, an ALD process, and/or an ion implantation process to form the gradient. However, the PVD, CVD, ALD, and ion implantation processes are presented by way of example and not by way of limitation.

For example, in various embodiments, an outdiffusion and/or outgassing process can be utilized to form the gradient. Dopant atoms and/or particular mixtures or compounds included in the formation of the PCMs, for example, can outdiffuse from regions having a high level to adjacent regions having a low level, e.g., when a sharp difference exists between the levels in the adjacent regions and/or an elevated temperature is applied thereto, among other factors used to promote outdiffusion. Alternatively and/or in addition, outgassing can be utilized, for example, to release dopant gases from an exposed surface of a PCM, for example, and/or the mixtures or compounds included in the formation of the PCMs, for example, can undergo a phase change, e.g., by an elevated temperature that is applied thereto, that causes transition for solid to gas, the gas being released from the exposed surface of a PCM as a result. As such, a gradient can be formed and/or contributed to by depositing, e.g., via the PVD, CVD, ALD, and/or ion implantation processes previously described, and outdiffusing and/or outgassing at least one of the species more than the other species.

Accordingly, the PCM gradient 230 illustrated in FIG. 2A and/or the PCM gradient 240 illustrated in FIG. 2B can, in a number of embodiments, serve as an active PCM for storage elements, such as storage elements shown in FIG. 1A at 103 or shown in FIG. 1B at 120, for instance. The memory cell structure can, in a number of embodiments, further include a first electrode, e.g., FIG. 1B at 122 or 126, coupled to a first conductive line, e.g., e.g., FIG. 1A at 105 or 107, FIG. 1B at 114 or 116, corresponding to the memory cell, and a second electrode, e.g., FIG. 1B at 122 or 126, formed on the PCM gradient, the second electrode coupled to a second conductive line, e.g., FIG. 1A at 105 or 107, FIG. 1B at 114 or 116, corresponding to the memory cell.

FIG. 3 is a cross-sectional view of a portion of a memory device comprising a phase change memory structure in accordance with a number of embodiments of the present disclosure. As an example, FIG. 3 can be a cross-section of a portion of memory array 100 illustrated in FIG. 1A. The memory device 350 includes a number of phase change memory cell structures having a PCM gradient formed in accordance with embodiments described herein. The example illustrated in FIG. 3 includes the portion of the memory device showing a stack 352 that has a phase change memory cell having a PCM gradient, e.g., PCM gradient structures such as those described in FIGS. 2A-2B. The stack 352 and separate stacks (not shown) can be formed by a masking and etching process through the appropriate materials, for example, in addition to embodiments of the example processes presented herein for forming the PCM gradient structures.

The PCM gradient 356 is formed on a first electrode 360 (e.g., a heater electrode), as described herein. In some embodiments, the first electrode 360 can be formed in a dielectric material 364 (e.g., SiO$_2$) upon which the PCM gradient 356 is also farmed, although embodiments are not so limited. The stack 352 includes a second electrode 354 (e.g., a top electrode) fanned on the PCM gradient 356. Region 362 represents an active region of the PCM gradient 356, e.g., a region actively changing between an amorphous state and a crystalline state.

The electrode 360 can be formed on a conductive contact 366 coupled to a conductive line corresponding to the memory cell. In this example, the conductive contact 366 is a drain contact. That is, the conductive contact 366 couples the stack 352 to a drain region 374 of the access device 370 (e.g., an access transistor). In this example, the access device 370 has associated source 372, drain 374, and gate 376 regions and are formed in a base substrate 378. However, embodiments are not limited to a particular type of access device. For instance, as described above, the access devices 370 can be an OTS, a MOSFET, a BJT, and/or a diode, among other types of access devices for operating phase change memory cells. As an example, the base substrate 378 can be a p-type semiconductor substrate with n-type source 372 and drain 374 regions.

In this example, the memory device 350 also includes a source contact 367 coupled to the source region 372 of the access device 370. As an example, the gate 376 of the access device 370 can be coupled to a word line, e.g., word lines 105-1 to 105-N in FIG. 1A, and the electrode 354 can be coupled to a bit line, e.g., bit lines 107-1 to 107-M in FIG. 1A. The source contact 367 and drain contact 366 can be formed in a dielectric material 368 (e.g., SiO$_2$) and a dielectric material 369 (e.g., SiN) can be formed around a gate stack of the access device 370 (e.g., the access transistor) to electrically insulate the access device 370 (e.g., the access transistor) from the contacts 366 and 367. However, embodiments are not limited to the particular configuration of the memory device 350 illustrated in FIG. 3.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion and not a restrictive one. Combination of the above embodiments, and other embodiments not specifically described herein, will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a memory cell, comprising:
   forming a first electrode material coupled to a first conductive line;
   forming a phase change material gradient on the first electrode material, wherein a phase change material comprises a chemical gradient with an active material that actively changes between an amorphous state and a crystalline state that is formed at least partially by a predetermined selection of a plurality of different chemicals to be deposited from separate sources;
   forming a second electrode material on the phase change material gradient; and
   forming a second conductive line coupled to the second electrode material.

2. The method of claim 1, wherein forming the first electrode material includes forming the first electrode material on the first conductive line corresponding to the memory cell.

3. The method of claim 1, wherein forming the phase change material gradient includes forming the active material of a phase change memory cell.

4. The method of claim 1, wherein forming the phase change material gradient includes forming a number of chalcogenide alloys.

5. The method of claim 4, wherein forming the number of chalcogenide alloys includes forming at least one of the number of chalcogenide alloys having a variation in stoichiometry.

6. The method of claim 5, wherein forming the at least one of the number of chalcogenide alloys having the variation in stoichiometry includes forming a number of different and adjacent chalcogenide alloys.

7. The method of claim 5, further comprising forming the at least one of the number of chalcogenide alloys by supplying a first element at a substantially constant rate and/or concentration and supplying a second element with a predetermined variation in a rate and/or a concentration.

8. The method of claim 7, further comprising supplying a third element with a predetermined variation in a rate and/or a concentration.

9. The method of claim 5, further comprising forming the at least one of the number of chalcogenide alloys by supplying a first element with a predetermined increase in a rate and/or a concentration and by supplying a second element with a predetermined decrease in the rate and/or the concentration.

10. A method of forming a memory cell, comprising:
    forming an active storage element material and an active select device material arranged in series between a pair of electrodes; and
    forming, at least partially by a predetermined selection of a plurality of different chemicals to be deposited from separate sources, a chemical gradient in a phase change material in at least one of the active storage element material and the active select device material.

11. The method of claim 10, further comprising forming the active storage element material and the active select device material from a number of chalcogenide alloys.

12. The method of claim 10, further comprising forming an electrode material between the active storage element material and the active select device material.

13. The method of claim 10, wherein forming the active storage element material includes forming an active resistance variable storage element material.

14. The method of claim 10, wherein forming the active select device material includes forming an ovonic threshold switch.

15. The method of claim 10, including utilizing an ion implantation process to form the gradient.

16. The method of claim 15, wherein utilizing the ion implantation process includes implanting a dopant.

17. The method of claim 10, including utilizing a physical vapor deposition process to form the gradient.

18. The method of claim 10, including utilizing an outdiffusion and/or outgassing process to form the gradient.

19. A memory cell structure, comprising:
- a phase change material of a memory cell formed between a first electrode and a second electrode, wherein the phase change material comprises a phase change material gradient; and
- a select device material of the memory cell formed between the second electrode and a third electrode.

20. The structure of claim 19, wherein the first electrode is coupled to a conductive line corresponding to the memory cell.

21. The structure of claim 19, wherein the third electrode is coupled to a conductive line corresponding to the memory cell.

22. The structure of claim 19, wherein the phase change material gradient is formed from a number of different chalcogenide alloys.

23. The structure of claim 22, wherein at least one of the number of different chalcogenide alloys is formed having a variation in stoichiometry.

24. The structure of claim 19, wherein the phase change material gradient is formed from at least one chalcogenide alloy having a variation in a stoichiometric contribution of at least one of a number of elements of the chalcogenide alloy to form the gradient.

25. The structure of claim 24, wherein the gradient is formed having an increase in the stoichiometric contribution of at least one of the number of elements from a region adjacent to the first electrode to a region adjacent to the second electrode.

26. The structure of claim 24, wherein the gradient is formed having a decrease in the stoichiometric contribution of at least one of the number of elements from a region adjacent to the first electrode to a region adjacent to the second electrode.

27. The structure of claim 24, wherein the gradient is formed having an increased or decreased stoichiometric contribution of at least one of the number of elements between a region adjacent to the first electrode and a region adjacent to the second electrode relative to the region adjacent to the first electrode and the region adjacent to the second electrode.

28. A memory cell structure, comprising:
- a storage element material of a memory cell and a select device material of the memory cell arranged in series between a first electrode and a second electrode;
- a third electrode formed between the storage element material and the select device material; and
- a phase change material gradient in at least one of the storage element material and the select device material.

29. The structure of claim 28, wherein at least one of the storage element material and the select device material comprises a chalcogenide.

30. The structure of claim 29, wherein at least one of the storage element material and the select device material is formed with at least one chalcogenide alloy having a variation in stoichiometry.

\* \* \* \* \*